March 24, 1970 F. R. CORWIN 3,501,829
METHOD OF APPLYING CONTACTS TO A MICROCIRCUIT
Filed July 18, 1966
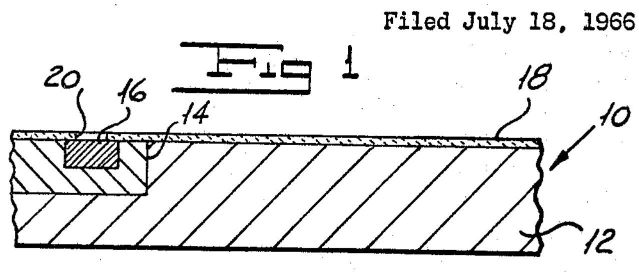
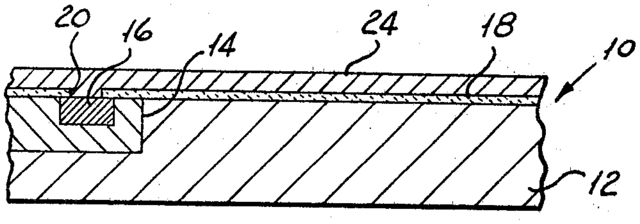
FIG. 2
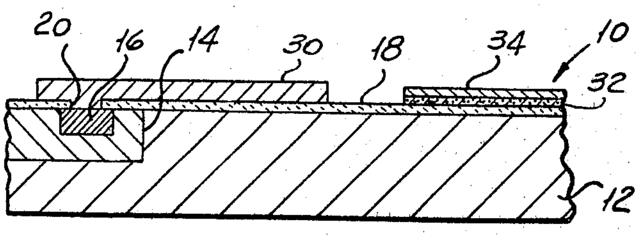
FIG. 3
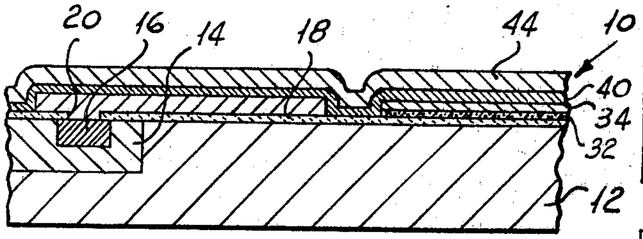
FIG. 4
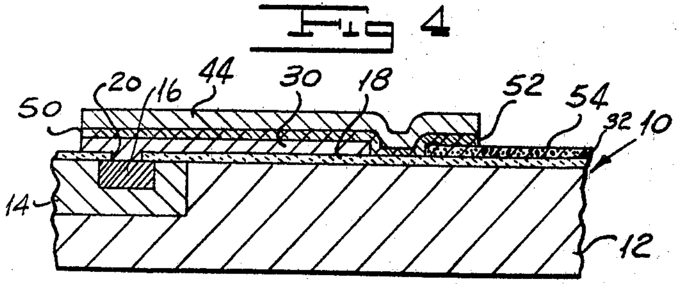
FIG. 5
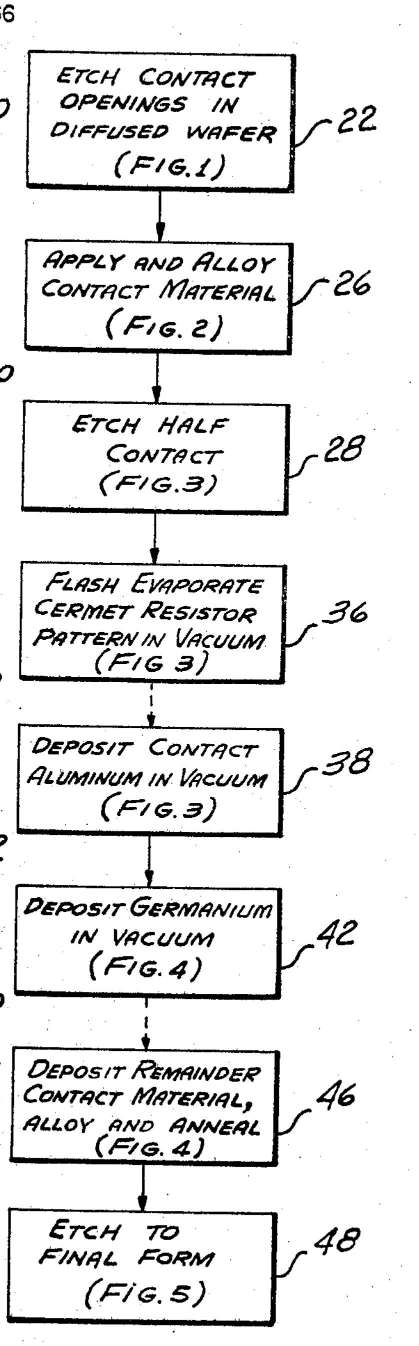
FIG. 6
INVENTOR.
Frank R. Corwin
BY
Shenier & O'Connor
ATTORNEYS United States Patent Office 3,501,829
Patented Mar. 24, 1970

3,501,829

METHOD OF APPLYING CONTACTS TO A MICROCIRCUIT

Frank R. Corwin, Milford, Conn., assignor to United Aircraft Corporation, East Hartford, Conn., a corporation of Delaware Filed July 18, 1966, Ser. No. 565,845
Int. Cl. B01j *17/00;* H01l *5/04*
U.S. Cl. 29—577 1 Claim

ABSTRACT OF THE DISCLOSURE

In general my invention contemplates the provision of an improved hybrid microcircuit and method of making the same in which I form a low resistance electrical contact and a good mechanical bond between aluminum being deposited and previously deposited aluminum by first depositing germanium on the previously formed region to provide an intermediate germanium-aluminum alloy region between the new and old deposits.

BACKGROUND OF THE INVENTION

In the prior art circuits comprising both active and passive elements can of course be made up by using discrete parts, multiple circuit chips and associated wiring. While these circuits in general perform the function for which they are designed, they embody a number of defects which are of significance particularly in the present day wherein increased miniaturization is of great importance. Circuits of this type comprising interconnected elements have a relatively low packaging density. Moreover, they have high parasitics, are not particularly resistant to radiation, and have low thermal stability. In addition to these defects, manufacturing processes of the prior art are complicated and tedious.

It is desirable that circuits made up of both active and passive components be provided on a single substrate. Circuits of this type, which may be termed "hybrid" circuits, possess the advantages of low parasitics, high resistance to radiation, good thermal stability and high packaging density. While the advantages of integrated circuits of this type are recognized, attempts in the prior art to provide hybrid circuits incorporating both thin film passive and diffused active components on a single substrate have not proved satisfactory. First, they generally do not have good geometric delineation owing to the use of metal masks and silk screen techniques. Secondly, it has not been possible by use of techniques of the prior art to provide element interconnections having low contact resistance.

DESCRIPTION OF THE INVENTION

I have provided an improved hybrid microcircuit providing both thin film passive and diffused active components on a single substrate. My improved hybrid microcircuit overcomes the defects of circuits of the prior art. It has low parasitics, high resistance to radiation, good thermal stability and high packaging density, as well as good geometric delineation. It is more expeditiously manufactured than are interconnected multiple component circuits of the prior art. I have also provided a method of making my improved hybrid microcircuit.

One object of my invention is to provide an improved hybrid microcircuit which includes thin film passive and diffused active components on a single substrate.

Another object of my invention is to provide an improved hybrid microcircuit having a low contact resistance between the interconnections and the components of the circuit.

A further object of my invention is to provide an improved hybrid microcircuit having close tolerances and high packaging density.

Still another object of my invention is to provide an improved hybrid microcircuit which is more rapidly and expeditiously manufactured than are circuits of the prior art comprising interconnected discrete components.

Other and further objects of my invention will appear from the following description.

In the accompanying drawings which form part of the instant specification and which are to be read in conjunction therewith and in which like reference numerals are used to indicate like parts in the various views:

FIGURE 1 is a fragmentary sectional view of a circuit chip which I employ in making my improved hybrid microcircuit.

FIGURE 2 is a fragmentary sectional view of the chip shown in FIGURE 1 at one point in my process of making my improved hybrid microcircuit.

FIGURE 3 is a fragmentary sectional view of the circuit chip of FIGURE 2 at a further point in my process of making my improved hybrid microcircuit.

FIGURE 4 is a fragmentary sectional view of the circuit chip of FIGURE 2 at a still further point in my process of making my improved hybrid microcircuit.

FIGURE 5 is a fragmentary sectional view of my completed improved hybrid microcircuit.

FIGURE 6 is a block diagram illustrating the steps in formation of my improved hybrid microcircuit.

Referring now to the drawings, in making my improved hybrid microcircuit I start with a wafer indicated generally by the reference character 10 with all the required diffused circuitry completed. By way of example, the wafer 10 may include a silicon substrate 12 having a diffused region 14 containing a more highly doped region 16 to which contact is to be made. As is known in the art, the wafer 10 carries a thin silicon oxide film 18 on the upper surface thereof as viewed in FIGURE 1.

In the first step in my process of making my improved hybrid microcircuit, I form openings in the oxide film 18 to provide access to the surface areas of the chip at which contacts are to be made. This may be achieved by appropriate techniques known in the prior art. For example, an organic insulating photosensitive liquid is applied over the oxide coating 18 and is allowed to dry. Then the resist is exposed through a negative pattern of the holes to be formed to ultraviolet light. The resist is then developed in a suitable organic solvent and the unexposed resist washes away. Then the oxide 18 is etched away through the openings in the exposed portions of the resist. Next the resist is removed. Since techniques of this type are known in the art and since they are not per se a part of my invention, they will not be described in detail. By way of example, I have illustrated formation of a single oxide opening 20 in the film 18 to expose an area of the diffused region 16. This step is indicated schematically in FIGURE 6 by the block 22.

In the next step of my process of making my hybrid microcircuit, I vapor-deposit an aluminum film 24 over the surface of the oxide layer 18 and into contact with the region 16 through the opening 20. This operation may be carried out in a vacuum in any suitable manner known to the art. The vaporized aluminum travels away from the source in all directions in straight lines and condenses on the relatively cold surface of the oxide coating 18. In one particular application of my method I may deposit a film of a thickness of about 5000 A. Immediately following the deposition of the conductive material 24, I alloy the aluminum into the exposed portion of the region 16 by heating the wafer to a temperature of about 585° C. for about two minutes. The steps of depositing the layer 24 and of alloying the material to the exposed area of region 16 are indicated schematically in FIGURE 6 by the block 26.

Having provided the conductive film 24 I next etch it as indicated by the block 28 in FIGURE 6 to form half 30 of a conductor to be provided in the finished circuit as will be described hereinafter. This etching operation again is achieved by the photo resist technique outlined above. The film 24 has a resist applied thereto which is exposed to ultravoilet light through a negative of the half conductor pattern. After the resist is developed, the excess film 24 is etched away and then the resist is removed.

The next step in my process is the formation of passive circuit components by the deposition of suitable films on the oxide surface 18. By way of example, I will outline the formation of a portion of a resistor. First, I form a suitable resist mask on the surface of the wafer over the half 30 and with an opening defining the area in which I desire to form the resistor. As is known in the art, the resistor pattern can be formed by photolithographic techniques. Having formed the mask I place the wafer in a vacuum and flash-evaporate a suitable material into the mask opening to form a film 32. Film 32 may be any suitable material. Preferably I employ a cermet such as SiO—Cr powder. I so control the deposition of the cermet as to provide a resistance of any desired value above 100 ohms per square centimeter. Alternatively to using a silicon oxide chromium cermet, any other cermet providing the desired resistance characteristic can be used.

After having applied the layer 24 and before breaking the vacuum, I immediately vacuum deposit a thin film 34 of aluminum to make contact to the resistor 32. This layer 34 is so controlled as to provide a resistance of about 25 ohms per square centimeter. Owing to the fact that the contact aluminum film 34 is applied to the cermet film 32 without breaking the vacuum, a good mechanical bond and a low resistance electrical contact is achieved between the cement film 32 and the aluminum film 34. I deposit a thickness of film 34 which is just sufficient to permit subsequent alloying to the film in the manner to be described. This film 34 may be about 100 A. thick. The step of flash-evaporating the resistive material is indicated by the block 36 in FIGURE 3. While block 38 indicates the deposition of the aluminum contact film 34, the broken line leading from block 36 to block 38 indicates that these two operations are performed without breaking the vacuum.

When the half conductor 30 and the films 32 and 34 have been formed in the manner described above, the resist pattern is removed. Next, I place the wafer 10 in a vacuum and first deposit a thin film 40 of germanium over the entire surface of the wafer. I have discovered that a germanium layer having a thickness of about 300 A. is suitable for forming the alloy to be described. The step of depositing germanium is indicated by the block 42 in FIGURE 6. After depositing the film 40 and without breaking the vacuum, I next deposit the remaining contact aluminum in the form of a layer 44 having a thickness of about 5000 A. units. This operation is indicated schematically in FIGURE 6 by the block 46. Again the broken line running from block 42 to the block 46 indicates that the operation of depositing germanium film and that of depositing the aluminum layer are carried out in the same vacuum. When the film 40 and the layer 44 have thus been deposited, I alloy the germanium into the underlying aluminum half contact 30 and into the film 34, as well as into the superposed aluminum layer 44. This provides a good electrical contact of low resistivity and a firm mechanical bond between the last deposited aluminum layer 44 and the previously deposited aluminum half contact 30 and the aluminum film 34. The alloying takes place at a temperature of from 500 to 750° C. Annealing of the structure may be accomplished by varying the time and the temperature of alloying.

After the annealing operation, I apply another resist mask to the structure and etch away the unmasked portions to form the final structure shown in FIGURE 5. Block 48 indicates the final etching step. The alloyed region is indicated by the reference character 50 in FIGURE 5. In the course of this final etching operation the aluminum film 34 is reduced to an alloy contact pad 52 and a portion 54 of the surface of the cermet resistor is exposed. One of the advantages of my structure is that conventional packaging techniques can be employed using the structure of FIGURE 5 is directly as that structure requires no additional protection.

It will readily be appreciated that while I have illustrated only the form of one conductor leading from a contact area of an active semiconductor region 16 to a passive resistive component 32, I may make a wide variety of interconnections. Moreover, while I have described the use of aluminum in conjunction with germanium to form the conductor, other conductive material and other alloying materials might be employed.

One significant feature of my invention is that by employing the technique outlined above I am able to make a relatively low resistivity contact between the previously deposited half conductor 30 and the other half conductor 44, as well as between the conductor 44 and the pad 52. That is, I have discovered that such a low resistance contact can be made by the use of the intermediate alloying film with the conductive material 44 being deposited in the same vacuum even though some oxide is formed on top of the half conductor 30 and the film 40 before the alloying material and final conductive material are applied.

In summary, in order to practice my method of making my improved hybrid microcircuit I first form half conductor 30 and alloy it to the material of region 16 by use of conventional techniques. I next flash-evaporate the cermet film 32 and apply the contact aluminum film 34 in the same vacuum. Next the germanium film 40 and the final aluminum contact material 44 are applied in the same vacuum and are alloyed and annealed to the half conductor 30 and to the film 40. Finally, the unwanted material is etched away to leave the structure shown in FIGURE 5.

It will be seen that I have accomplished the objects of my invention. I have provided an improved hybrid microcircuit comprising active and passive components in the same slice.

My improved hybrid microcircuit has low parasitics, high resistance to radiation and good thermal stability. It has high packaging density and good geometric delineation. It is more expeditously manufactured than are interconnected multiple component circuits of the prior art. I have provided a method for making my improved hybrid microcircuit in a rapid and expeditious manner.

It will be understood that certain features and subcombinations are of utility and may be employed without reference to other features and subcombinations. This is contemplated by and is within the scope of my claim. It is further obvious that various changes may be made in details within the scope of my claim without departing from the spirit of my invention. It is, therefore, to be understood that my invention is not to be limited to the specific details shown and described.

Having thus described my invention, what I claim is:

1. A method of making a hybrid microcircuit including the steps of forming a contact opening through an insulating film on a substrate to an active semiconductor region of said substrate, forming a first portion of a connector of aluminum contacting said region through said opening and extending along the surface of said film, flash evaporating cermet powder on said film with said substrate in a vacuum and at a location spaced from said opening to form a passive component at said location, depositing a thin film of aluminum on said passive component while maintaining said substrate in said vacuum, depositing a thin film of germanium over said connector and over said aluminum on said passive component with said substrate in a vacuum, depositing a continuous layer of aluminum over said germanium film while maintaining said substrate in said last named vacuum, and alloying said germanium with said aluminum to form a connection between said active region and said passive component.

References Cited

UNITED STATES PATENTS

| | | | |
|---|---|---|---|
| 3,325,258 | 6/1967 | Fottler | 29—183.5 |
| 3,292,241 | 12/1966 | Carroll | 29—155.5 |
| 3,367,795 | 2/1968 | Stutzman | 117—212 |
| 3,345,210 | 10/1967 | Wilson | 117—212 |
| 3,092,522 | 6/1963 | Knowles et al. | 29—589 |
| 3,266,127 | 8/1966 | Harding et al. | 29—589 |

PAUL M. COHEN, Primary Examiner

U.S. Cl. X.R.

29—587; 317—235